United States Patent
Wu et al.

(10) Patent No.: US 10,236,198 B2
(45) Date of Patent: Mar. 19, 2019

(54) METHODS FOR THE CONTINUOUS PROCESSING OF SUBSTRATES

(71) Applicant: Applied Materials, Inc., Santa Clara, CA (US)

(72) Inventors: Banqiu Wu, Sunnyvale, CA (US); Nag B. Patibandla, Pleasanton, CA (US); Toshiaki Fujita, Sakura (JP); Ralf Hofmann, Soquel, CA (US); Pravin K. Narwankar, Sunnyvale, CA (US); Jeonghoon Oh, Saratoga, CA (US); Srinivas Satya, Sunnyvale, CA (US); Li-Qun Xia, Cupertino, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 15/689,550

(22) Filed: Aug. 29, 2017

(65) Prior Publication Data

US 2017/0365491 A1  Dec. 21, 2017

Related U.S. Application Data

(62) Division of application No. 13/755,891, filed on Jan. 31, 2013, now Pat. No. 9,748,125.
(Continued)

(51) Int. Cl.
C23C 16/458  (2006.01)
H01L 21/673  (2006.01)
(Continued)

(52) U.S. Cl.
CPC ........ *H01L 21/673* (2013.01); *C23C 16/4558* (2013.01); *C23C 16/4584* (2013.01);
(Continued)

(58) Field of Classification Search
CPC .............. C23C 16/458; C23C 16/4583; C23C 16/4582
See application file for complete search history.

(56) References Cited

U.S. PATENT DOCUMENTS 3,652,444 A * 3/1972 Lester ................ B01J 3/006
                                                    204/298.25
5,232,506 A    8/1993 Kawase
(Continued)

FOREIGN PATENT DOCUMENTS

KR       10-0670762 B1    1/2007
KR    20-2009-0001924 A   2/2009
(Continued)

OTHER PUBLICATIONS

Roper, Christopher S., et al., "Single-Source Chemical Vapor Deposition of SiC Films in a Large-Scale Low-Pressure CVD Growth, Chemical, and Mechanical Characterization Reactor". Journal of the Electrochemical Society, 153 (8) C562-C566 (2006).*
(Continued)

*Primary Examiner* — Bret P Chen
(74) *Attorney, Agent, or Firm* — Servilla Whitney LLC

(57) ABSTRACT

Methods of processing a plurality of substrates using a processing chamber with bottom and top openings and a plurality of processing slots are provided. A substrate positioned on a carrier is loaded into a first end of a processing chamber body through the bottom opening. The carrier is moved through a plurality of processing slots to a top opening at a second end of the chamber body and then removed from the processing chamber through the top opening.

17 Claims, 7 Drawing Sheets

Related U.S. Application Data

(60) Provisional application No. 61/593,229, filed on Jan. 31, 2012.

(51) Int. Cl.
*H01L 21/677* (2006.01)
*C23C 16/455* (2006.01)
*C23C 16/54* (2006.01)

(52) U.S. Cl.
CPC ........ *C23C 16/45546* (2013.01); *C23C 16/54* (2013.01); *H01L 21/677* (2013.01); *H01L 21/67346* (2013.01)

(56) References Cited

U.S. PATENT DOCUMENTS

| | | | |
|---|---|---|---|
| 5,327,624 A | 7/1994 | Hirayama | |
| 5,749,723 A * | 5/1998 | Okase | C30B 31/10 432/152 |
| 6,203,619 B1 | 3/2001 | McMillan | |
| 6,299,691 B1 * | 10/2001 | Oda | C23C 16/46 118/715 |
| 6,318,945 B1 | 11/2001 | Hofmeister | |
| 6,402,849 B2 | 6/2002 | Kwag et al. | |
| 6,483,081 B1 * | 11/2002 | Batchelder | H01L 21/67109 118/50.1 |
| 6,821,563 B2 | 11/2004 | Yudovsky | |
| 7,359,767 B2 * | 4/2008 | Rice | B65G 37/02 414/217 |
| 7,413,982 B2 | 8/2008 | Levy | |
| 7,456,429 B2 | 11/2008 | Levy | |
| 7,572,686 B2 | 8/2009 | Levy et al. | |
| 7,591,714 B2 | 9/2009 | Ko et al. | |
| 7,789,961 B2 | 9/2010 | Nelson et al. | |
| 2003/0103836 A1 | 6/2003 | Beaulieu et al. | |
| 2004/0067641 A1 | 4/2004 | Yudovsky | |
| 2005/0188923 A1 * | 9/2005 | Cook | C23C 16/4584 118/728 |
| 2006/0223233 A1 | 10/2006 | Zhao et al. | |
| 2007/0235287 A1 * | 10/2007 | Rice | H01L 21/67724 198/419.3 |
| 2007/0258796 A1 * | 11/2007 | Englhardt | H01L 21/67766 414/217 |
| 2007/0274813 A1 * | 11/2007 | Rice | B65G 37/02 414/217 |
| 2007/0295274 A1 * | 12/2007 | Webb | C23C 16/4583 118/719 |
| 2008/0014057 A1 | 1/2008 | Juergensen et al. | |
| 2008/0166880 A1 | 7/2008 | Levy | |
| 2008/0193643 A1 | 8/2008 | Dip | |
| 2009/0078204 A1 | 3/2009 | Kerr et al. | |
| 2009/0081366 A1 | 3/2009 | Kerr et al. | |
| 2009/0130858 A1 | 5/2009 | Levy | |
| 2009/0194659 A1 * | 8/2009 | Gao | H05K 13/0061 248/346.01 |
| 2009/0217878 A1 | 9/2009 | Levy et al. | |
| 2009/0308030 A1 * | 12/2009 | Elliott | H01L 21/6773 53/492 |
| 2010/0050943 A1 | 3/2010 | Kato et al. | |
| 2010/0055312 A1 | 3/2010 | Kato et al. | |
| 2010/0068383 A1 | 3/2010 | Kato | |
| 2010/0116209 A1 | 3/2010 | Kato et al. | |
| 2010/0078867 A1 * | 4/2010 | Nakashima | H01L 21/67057 269/303 |
| 2010/0248423 A1 | 9/2010 | Nelson et al. | |
| 2012/0251964 A1 | 10/2012 | Inagawa et al. | |
| 2014/0042111 A1 | 3/2014 | Yang et al. | |

FOREIGN PATENT DOCUMENTS

| | | |
|---|---|---|
| KR | 10-2009-0055443 A | 6/2009 |
| KR | 10-2009-0069075 A | 6/2009 |
| KR | 10-0908987 B1 | 7/2009 |
| KR | 10-0920324 B1 | 10/2009 |
| KR | 10-0931331 B1 | 12/2009 |
| KR | 10-2010-0002886 A | 1/2010 |
| KR | 10-2010-0003536 A | 1/2010 |
| KR | 10-0936694 B1 | 1/2010 |
| KR | 10-0936695 B1 | 1/2010 |
| KR | 10-0946159 B1 | 3/2010 |
| KR | 10-0949913 B1 | 3/2010 |
| KR | 10-0949914 B1 | 3/2010 |
| KR | 10-0960958 B1 | 6/2010 |
| KR | 10-2010-0077827 A | 7/2010 |
| KR | 10-1028408 B1 | 4/2011 |
| KR | 10-1028409 B1 | 4/2011 |
| KR | 10-1046611 B1 | 7/2011 |
| KR | 10-1072670 A | 10/2011 |
| KR | 10-1081694 A | 11/2011 |
| KR | 10-1095687 B1 | 12/2011 |
| KR | 10-1134277 B1 | 4/2012 |
| KR | 10-1135853 B1 | 4/2012 |
| KR | 10-1136302 B1 | 4/2012 |

OTHER PUBLICATIONS

"Boat Reactor for Low Pressure Chemical Vapor Deposition". Solved with COMSOL Multiphysics 4.2, 2011, pp. 1-16.*

* cited by examiner

METHODS FOR THE CONTINUOUS PROCESSING OF SUBSTRATES

CROSS-REFERENCE TO RELATED APPLICATIONS

This application is a Divisional of U.S. patent application Ser. No. 13/755,891, filed Jan. 31, 2013, now U.S. Pat. No. 9,748,125, issued Aug. 29, 2017, which claims priority to United States Provisional Application No. 61/593,229, filed Jan. 31, 2012, the entire disclosures of which are hereby incorporated by reference herein.

BACKGROUND

Embodiments of the present invention generally relate to an apparatus for processing substrates. More particularly, the invention relates to a processing platform for performing atomic layer deposition (ALD) and chemical vapor deposition (CVD) on substrates.

The process of forming semiconductor devices is commonly conducted in substrate processing platforms containing multiple chambers. In some instances, the purpose of a multi-chamber processing platform or cluster tool is to perform two or more processes on a substrate sequentially in a controlled environment. In other instances, however, a multiple chamber processing platform may only perform a single processing step on substrates; the additional chambers are intended to maximize the rate at which substrates are processed by the platform. In the latter case, the process performed on substrates is typically a batch process, wherein a relatively large number of substrates, e.g. 25 or 50, are processed in a given chamber simultaneously. Batch processing is especially beneficial for processes that are too time-consuming to be performed on individual substrates in an economically viable manner, such as for ALD processes and some chemical vapor deposition (CVD) processes.

The effectiveness of a substrate processing platform, or system, is often quantified by cost of ownership (COO). The COO, while influenced by many factors, is largely affected by the system throughput (i.e., the number of substrates processed per hour) and system footprint (i.e., the total floor space required to operate the system in a fabrication plant). Footprint typically includes access areas adjacent the system that are required for maintenance. Hence, although a substrate processing platform may be relatively small, if it requires access from all sides for operation and maintenance, the system's effective footprint may still be prohibitively large.

The semiconductor industry's tolerance for process variability continues to decrease as the size of semiconductor devices shrink. To meet these tighter process requirements, the industry has developed a host of new processes which meet the tighter process window requirements, but these processes often take a longer time to complete. For example, for forming a copper diffusion barrier layer conformally onto the surface of a high aspect ratio, 65 nm or smaller interconnect feature, it may be necessary to use an ALD process. ALD is a variant of CVD that demonstrates superior step coverage compared to CVD. ALD is based upon atomic layer epitaxy (ALE) that was originally employed to fabricate electroluminescent displays. ALD employs chemisorption to deposit a saturated monolayer of reactive precursor molecules on a substrate surface. This is achieved by cyclically alternating the pulsing of appropriate reactive precursors into a deposition chamber. Each injection of a reactive precursor is typically separated by an inert gas purge to provide a new atomic layer to previous deposited layers to form an uniform material layer on the surface of a substrate. Cycles of reactive precursor and inert purge gases are repeated to form the material layer to a desired thickness.

The biggest drawback with ALD techniques is that the deposition rate is much lower than typical CVD techniques by at least an order of magnitude. For example, some ALD processes can require a chamber processing time from about 10 to about 200 minutes to deposit a high quality layer on the surface of the substrate. In choosing such ALD and epitaxial processes for better device performance, the cost to fabricate devices in a conventional single substrate processing chamber would increase due to very low substrate processing throughput. Hence, when implementing such processes, a batch processing approach is needed to be economically feasible.

However, the quality of the films deposited by a batch processing system decrease as the throughput is increased. Often, better film quality is obtained by a single-wafer processing system. Therefore, there is a need for a ALD and CVD substrate processing chambers to maximize substrate processing throughput and minimize footprint, without sacrificing the production of high film quality.

SUMMARY

Embodiments of the present invention generally provide substrate processing chambers and systems suitable for ALD or CVD processing of substrates with minimized chamber footprint and high throughput. In one or more embodiment, a continuous substrate processing chamber for processing a plurality of substrates includes a chamber body, a substrate-in opening disposed on a first end of the chamber body, a substrate-out opening disposed on a second end of the chamber body, and a plurality of processing slots formed between the first end and the second end of the chamber body. Each processing slot is in fluid communication with a gas delivery system to process at least one of the plurality of the substrates upon transferring the plurality of the substrates inside the chamber body and continuously moving the plurality of the substrates through each of the plurality of the processing slots.

In some embodiments, each of the plurality of processing slots processes one single substrate at a time. In one or more embodiments, each of the plurality of substrates is transferred inside the chamber body one at a time. In some embodiments, a substrate can be transferred into the chamber body via the substrate-in opening, processed from one processing slot, continuously moved to another processing slot within the chamber body, and transferred out of the chamber body via the substrate-out opening.

Some embodiments further comprise a substrate-latch mechanism positioned near the first end of the chamber body to receive at least one substrate to be processed inside the chamber body. In one or more embodiments, the substrate-latch mechanism supports a movable substrate carrier within the chamber body to support at least one substrate thereon.

In some embodiments, the plurality of substrate carriers space apart substrates within the chamber body and carry a substrate for processing through each of the processing slots. In one or more embodiments, each of the substrate carriers comprises a plurality of spacer pins. In some embodiments, the plurality of the substrate carriers are stacked vertically together inside the chamber body and spaced apart via the plurality of the spacer pins. In one or more embodiments, a volume for each processing slot has a height corresponding to the distance between two movable substrate carriers.

In another embodiment, a processing chamber for processing a plurality of substrates includes a chamber body, a substrate-in opening disposed on a first end of the chamber body, a substrate-out opening disposed on a second end of the chamber body, and a plurality of processing slots formed between the first end and the second end of the chamber body, wherein each processing slot is capable of processing at least one of the plurality of the substrates upon transferring each of the plurality of the substrates inside the chamber body via the substrate-in opening, continuously moving the plurality of the substrates through each of the plurality of the processing slots, and transferring each of the plurality of the substrates out of the chamber body via the substrate-out opening.

In still another embodiment, a substrate processing system for processing a plurality of substrates includes a first movable substrate carrier, a second movable substrate carrier, and a processing chamber. Each of the first and the second movable substrate carriers comprise a plurality of spacer pins. The first movable substrate carrier to support at least a first substrate thereon. The second movable substrate carrier to support at least a second substrate thereon. The processing chamber includes a chamber body, a substrate-in opening disposed on a first end of the chamber body, a substrate-out opening disposed on a second end of the chamber body, and a plurality of processing slots formed between the first end and the second end of the chamber body. Each processing slot is in fluid communication with a gas delivery system and capable of processing the first and the second substrates upon transferring the first and the second substrates inside the chamber body and continuously moving the first and the second movable substrate carriers from one processing slot through the next one of the plurality of the processing slots.

In some embodiments, the first and the second movable substrate carriers are stacked together inside the chamber body of the processing chamber and spaced apart via the plurality of the spacer pins. In some embodiments, each processing slot is in fluid communication with a gas delivery system.

Some embodiments further comprise a substrate-latch mechanism positioned near the first end of the chamber body and adapted to receive the first and the second substrates inside the chamber body. In one or more embodiments, the substrate-latch mechanism latches the first and the second movable substrate carriers being stacked inside the chamber body.

Some embodiments further comprise a transfer robot to transfer the first substrate supported on the first movable substrate carrier into the processing chamber via the substrate-in opening for processing the first substrate through the plurality of the processing slots.

In one or more embodiments, after the first substrate is processed through the plurality of the processing slots inside the processing chamber, the first substrate supported on the first movable substrate carrier is transferred out of the second end of the processing chamber via the substrate-out opening.

In yet another embodiment, a method for processing a plurality of substrates is provided and includes transferring at least one of the plurality of substrates inside the chamber body of a processing chamber via a substrate-in opening disposed on a first end of the chamber body, continuously moving the plurality of the substrates through each of a plurality of the processing slots formed between the first end and a second end of the chamber body, and transferring at least one of the plurality of substrates out of the chamber body via a substrate-out opening disposed on the second end of the chamber body, wherein each processing slot is in fluid communication with a gas delivery system and capable of processing at least one of the plurality of the substrates upon transferring the plurality of the substrates within the chamber body.

In some embodiments, while the second substrate is being transferred inside chamber body, the first substrate of the plurality of substrates is transferred out of the chamber body via a substrate-out opening disposed on the second end of the chamber body. In one or more embodiments, a first substrate is transferred and moved on a first movable substrate carrier, the first movable substrate carrier comprising a plurality of spacer pins to separate the first substrate supported thereon from a second substrate supported on a second movable substrate carrier while the first and the second movable substrate carriers are moved through each of a plurality of the processing slots formed between the first end and a second end of the chamber body to process at least one of the plurality of the substrates.

In yet another embodiment, a method for processing a plurality of substrates includes transferring a first substrate of the plurality of substrates inside the chamber body of a batch processing chamber via a substrate-in opening disposed on a first end of the chamber body, continuously moving the plurality of the substrates through each of a plurality of the processing slots formed between the first end and a second end of the chamber body, and transferring, while the first substrate is being transferred inside chamber body, a second substrate of the plurality of substrates out of the chamber body via a substrate-out opening disposed on the second end of the chamber body.

In yet another embodiment, a method for processing a plurality of substrates includes transferring a first movable substrate carrier inside the chamber body of a processing chamber via a substrate-in opening disposed on a first end of the chamber body, continuously moving the first and the second movable substrate carriers through each of a plurality of the processing slots formed between the first end and a second end of the chamber body, and transferring the first movable substrate carrier having the first substrate thereon out of the chamber body via a substrate-out opening disposed on the second end of the chamber body. The first movable substrate carrier is adapted to support thereon a first substrate of the plurality of substrates and having a plurality of spacer pins to separate the first substrate supported thereon from a second substrate supported on a second movable substrate carrier. Each processing slot is in fluid communication with a gas delivery system and capable of processing at least one of the plurality of the substrates.

The processing chamber can be part of a multi-chamber substrate processing system, which includes at least one processing chamber, a substrate transfer robot that is adapted to transfer substrates in and out of various processing chambers, lock luck chambers, and/or a factory interface. The processing slots may be maintained at atmospheric pressure, under sub-atmospheric pressure, or under vacuum. In some embodiments, the substrate processing system comprises at least one processing chamber, two load lock chambers, and a factory interface.

A fluid delivery system may be in fluid communication with the internal process volume of the at least one processing chamber and may be positioned in a facility tower proximate thereto. A system control and management system may be positioned adjacent the multi-chamber substrate processing system.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Figure 1:
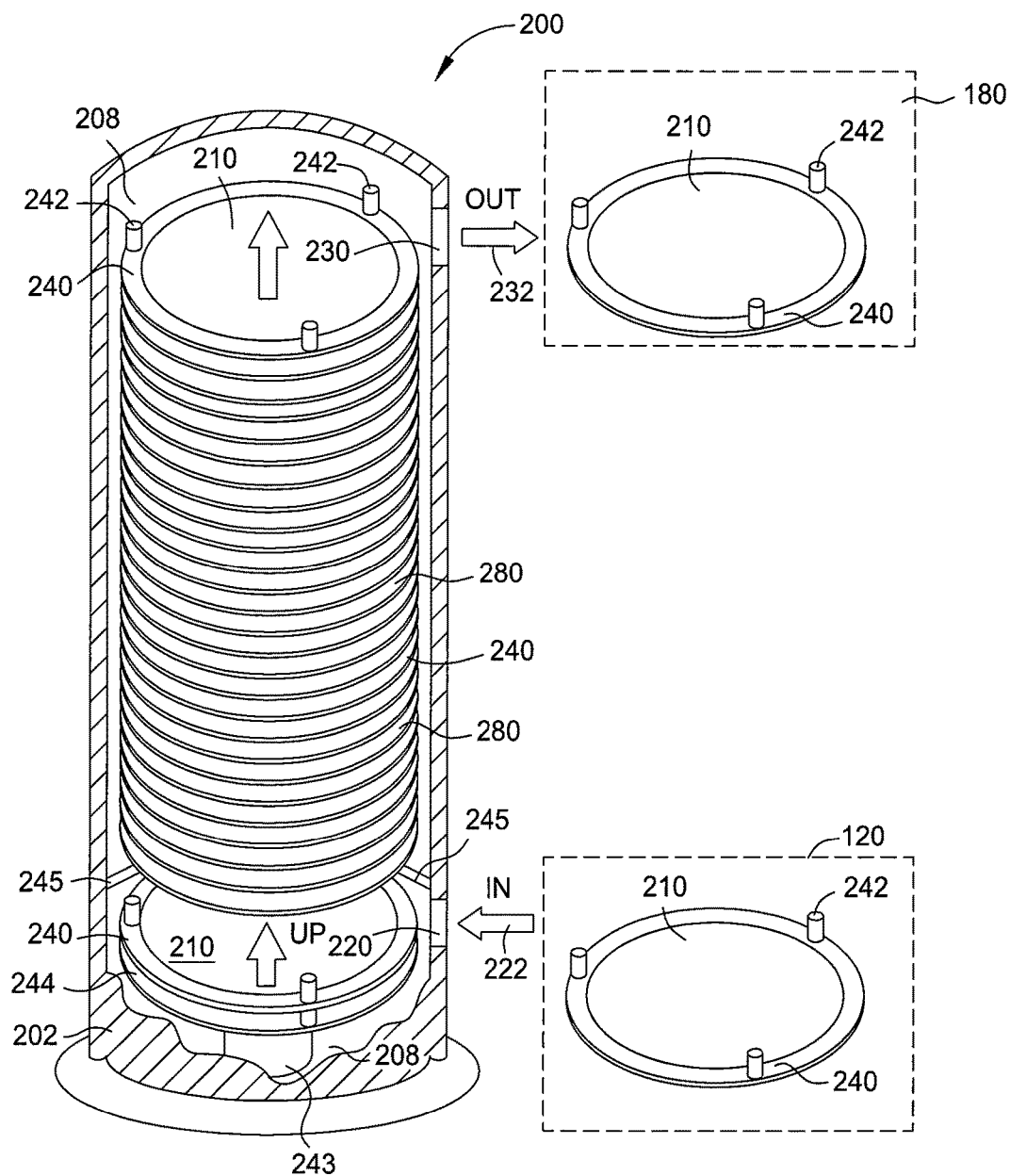
FIG. 1 is a perspective view of a substrate processing chamber, in accordance with one or more embodiment of the invention.

Embodiments of the present invention generally provide a substrate processing chamber for maximizing throughput and minimizing system footprint. The processing chamber is designed to be used in a continuous multi-substrate processing method and tailored to meet tighter process window requirements of existing and new ALD and CVD substrate deposition applications. In general, the chamber volume of the processing chamber is large enough to concurrently process multiple substrates. Each of the multiple substrates is processed, continuously and one after another, inside the processing chamber, and high-quality film can be deposited and consistently obtained on each and every one of the multiple substrates.

In some embodiments, the throughput is improved by using the substrate processing chamber as described herein to load, unload, and process multiple substrates continuously and save time in loading, unloading and processing each individual substrate. For example, the throughput (the number of substrates processed per hour) of such a processing chamber can be about 20 times (20×) or higher of the throughput of a single-wafer substrate processing system or about 6 times (6×) of the throughput of a conventional multi-substrate processing system. Conventionally, a long waiting time is common when a processing chamber is idle and waiting for substrate loading and unloading, prior to and after substrate processing. Here, a continuous process is designed for a substrate processing chamber where the chamber idle time can be avoided and saved because, as a plurality of substrates are processed inside the substrate processing chamber, there are other substrates being continuously loaded in and unloaded out of the substrate processing chamber.

In addition, throughput of the substrate processing chamber is also improved in such a continuous process by not sacrificing the number of substrates processed per hour during pre-treatment and post-treatment of the substrates. For example, the substrate processing chamber is adapted to pre-heat each substrate prior to substrate processing and the time in ramping up the temperature of each substrate does not affect its throughput.

In some embodiments, the interior portion of the processing chamber is configured with multiple processing slots for processing a plurality of substrates and each processing slot is minimized to reduce footprint and accommodate, one after another, each substrate. The effective processing volume in each processing slot is kept to a minimum volume. Together, high throughput and small effective processing volume in the processing slots function to improve film deposition rate for each substrate.

In addition, once loaded inside the processing chamber, each substrate is designed to be processed through each and every one of the multiple processing slots.

Accordingly, substrate processing uniformity and deposited film quality are improved because each substrate is moved and passed through each of the processing slots and encountered the same processing environment and conditions when traveled continuously through the interior portion of the processing chamber. It is observed that the properties of a deposited film on a substrate processed by the processing chamber are comparable or better than those by a single-wafer processing system.

FIG. 1 is a perspective view of a processing chamber 200. The processing chamber 200 is capable of simultaneously processing multiple substrates (e.g., a plurality of substrates 210). The processing chamber 200 generally includes an internal region 208, which is enclosed within a chamber body 202, disposed within the interior portion of the processing chamber 200, and configured with multiple processing slots 280. Each processing slot 280 is capable of accommodating at least one substrate 210 and is connected to a gas distribution system for performing a processing step or a portion of an ALD or CVD process therein.

In one or more embodiment, the processing chamber 200 is capable of loading at least one single substrate 210 from one end of the chamber body 202 (e.g., via the first opening 220 positioned near the bottom end of the chamber body 202) and unloading another substrate from another end (e.g., via the second opening 230 positioned near the top end of the chamber body 202). In some embodiments, each of the plurality of the substrates 210 is transferred inside the chamber body 202, one substrate at a time. In one or more embodiment, the processing chamber 200 is adapted to concurrently transfer/load one substrate inside the chamber body 202 and transfer/unload another substrate out of the chamber body 202.

In some embodiments, at least one substrate 210 is disposed on the surface of a substrate carrier 240, and a single substrate carrier 240 carrying a substrate 210 can be movably transferred in and out of the processing chamber 200. The substrate carrier 240 carrying the substrate 210 thereon may be transferred into the processing chamber 200 in a substrate-in direction 222 (e.g., in a horizontal direction and via a slit valve near the first opening 220).

In addition, a plurality of spacer pins 242 are positioned on the outer circumference of each substrate carrier 240 to better receive each substrate 210. For example, three or more spacer pins 242 may be disposed on the substrate carrier 240 to surround the outer edges of the substrate 210 and prevent slippage of the substrate 210 during substrate transfer. In some embodiments, multiple substrate carriers 240 are vertically spaced apart via three or more spacer pins 242 located on the outer circumference of each substrate carrier 240. In some embodiments, the spacer pins 242 in-between the stacked substrate carriers 240 are positioned to separate the substrates 210 disposed on the stack of multiple substrate carriers 240 within the processing chamber 200. In addition, the spacer pins 242 provide a space between the substrates 210 and the substrate carrier 240 stacked above the substrates 210. In some embodiments, the surface of each substrate 210 disposed on the surface of the substrate carrier 240 and the height of the spacer pins 242 between two stacked substrate carriers 240 are provided to define a space for each processing slot 280 within the internal region 208 of the processing chamber 200.

Figure 2:
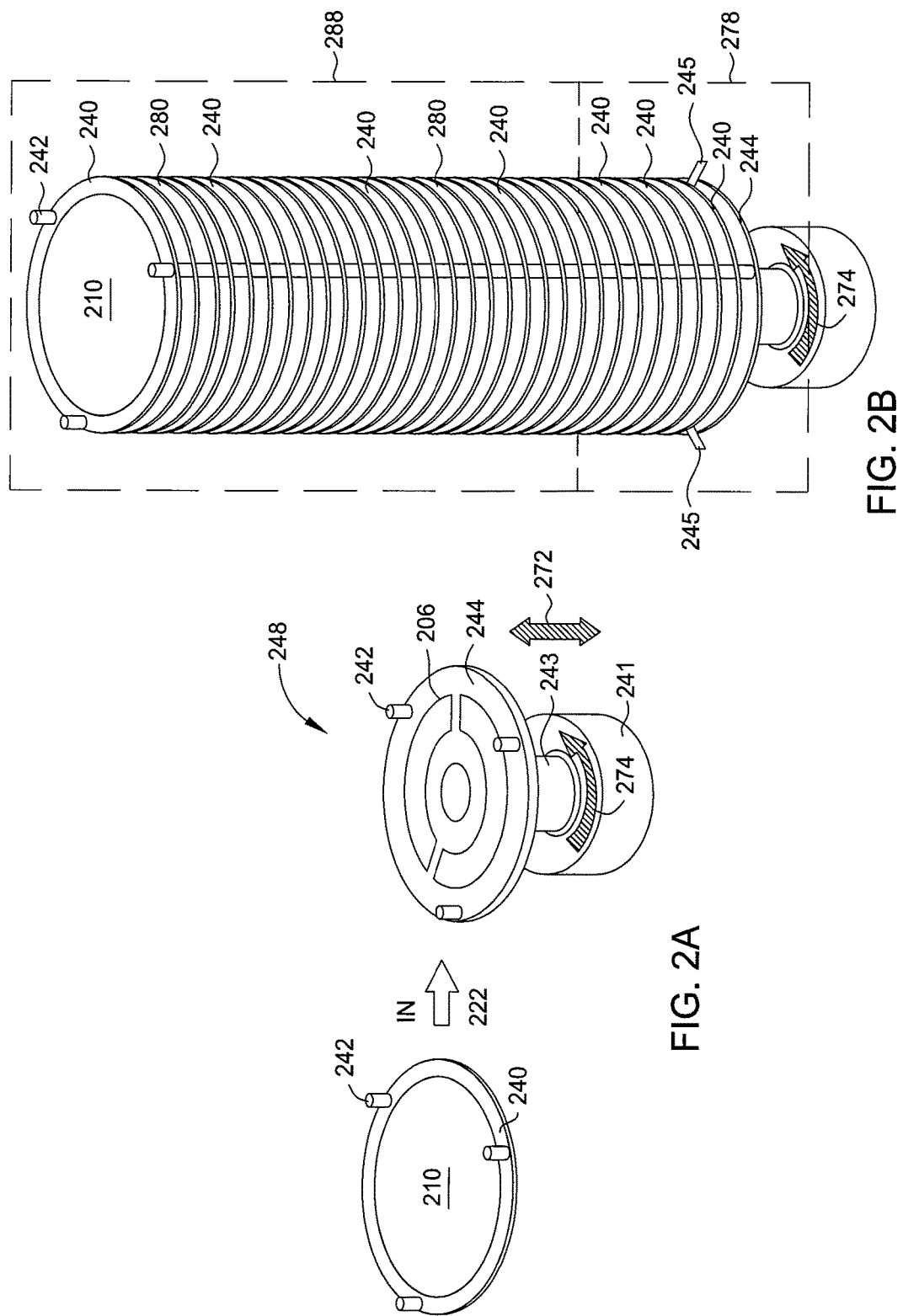
FIG. 2A is a perspective view of loading a substrate carrier with a substrate thereon onto a substrate support assembly disposed on one end of the substrate processing chamber, in accordance with another embodiment of the invention.
FIG. 2B is a schematic side view of a plurality of substrate processing slots as defined by a plurality of the substrate carriers inside a substrate processing chamber with the plurality of the substrates carried by the plurality of the substrate carriers above the substrate support assembly of FIG. 2A, and the configuration of a processing region and a pre-processing treatment region in the interior portion of the substrate processing chamber, in accordance with another embodiment of the invention.

FIG. 2A illustrates one example of loading one substrate carrier 240 with one substrate 210 thereon onto a substrate support assembly 244 disposed on one end of the substrate processing chamber 200. Once transferred inside the chamber body 202 (e.g., within the internal region 208 of the processing chamber 200), the substrate carrier 240 supporting the substrate 210 thereon is generally disposed on the substrate support assembly 244. The substrate support assembly 244 is adapted to secure and support the substrate carrier 240, with the substrate 210 thereon, being loaded inside the processing chamber 200.

In one or more embodiment, the substrate support assembly 244 includes a shaft 243 and a support mechanism 241 such that the substrate support assembly is able to move upwardly and downwardly (e.g., in a direction 272) and is capable of horizontal rotary movement (e.g., in a clockwise or counter-clockwise direction 274). In one or more embodiment, the substrate support assembly 244 may include a heating system 206 embedded therein for pre-treatment (e.g., pre-heating, among others) of a newly loaded substrate. The heating system 206 may include embedded resistive elements. Other heating systems adapted for radiant or convective heating of the substrates 210 and/or substrate carriers 240 disposed above the substrate support assembly 244 may also be used. Optionally, the surface of the substrate support assembly 244 may also include three or more spacer pins 242 located on its outer circumference for receiving the substrate carrier 240 disposed thereon.

FIG. 2B illustrates an example of a plurality of substrate processing slots 280, which are formed and separated by a plurality of the substrate carriers 240 stacked above the substrate support assembly 244. Each of the plurality of the substrate carriers 240 is loaded with and carries at least one substrate 210 thereon inside the processing chamber 200. The substrate support assembly 244 is capable of moving upwardly and supporting the new-loaded substrate carrier 240, together with the newly-loaded substrate thereon, as well as the whole stack of the substrate carriers 240 already disposed positioned inside the processing chamber 200

Next, the newly loaded substrate carrier 240 having the substrate 210 disposed thereon is received by a substrate-latch mechanism 245 positioned near the bottom end of the chamber body 202. The substrate-latch mechanism 245 may include three or more movable contacting latches positioned around the edges of the substrate carrier 240 for supporting the newly loaded substrate carrier 240 near the bottom end of the chamber body 202. In addition, once a plurality of substrate carriers 240 are loaded above the substrate support assembly 244 and stacked upwardly, one by one, inside the processing chamber 200, the substrate-latch mechanism 245 is capable of supporting a plurality of the substrate carriers 240 having a plurality of the substrates 210 thereon.

As a result, each of the plurality of the substrates 210 is disposed on and carried by one substrate carrier 240, and the plurality of the substrate carriers 240 are stacked vertically one on top of another within the chamber body 202 of the processing chamber 200. Accordingly, the plurality of the substrates 210 are disposed on the surface of the substrate carriers 240 to be concurrently secured and supported by the substrate-latch mechanism 245 and continuously and upwardly processed within the internal region 208 with continuous substrate loading onto the substrate support assembly 244. Thus, two or more substrate carriers 240 are vertically stacked, one on top of another one, within the processing chamber 200.

As shown in FIG. 2B, in one or more embodiment, the interior portion of the processing chamber 200 may include a processing region 288 and a pre-processing treatment region 278. The processing region 288 are formed by a plurality of pressing slots 280 for processing a plurality of substrate 210 by spatially separating the delivery of individual flow of process gases, purge gases and other reactive or non-reactive fluids onto the surface of each and every one of the plurality of the substrates 210. In addition to spatial separation, additionally or alternatively, the delivery of individual flow of process gases, purge gases and other fluids as required for an ALD or CVD substrate processing technique may be controlled temporally in each processing slot 280 (e.g., pulsing for a period of short time, such as in seconds) during the delivery of the individual flow of process gases, purge gases and other fluids onto the surface of each and every one of the plurality of the substrates 210

Each processing slot 280 is connected to a gas distribution system and a gas exhaust system. As shown in detail in FIGS. 3 and 4A, within each processing slot 280, process gasses, purge gases, and other reactive or non-reactive fluids are flown horizontally through the surface of each substrate 210 from one side of the processing slot 280 and being evacuated horizontally from another side of the processing. As shown in detail in FIG. 4B, the processing slots 280 are separated from each other vertically for a vertical distance, Dv. In some embodiments, the distance Dv is about the height of the volume of each processing slot 280.

In another embodiment, as shown in FIG. 2B, the pre-processing treatment region 278 may include a number of stacked substrate carriers 240 and the substrate support assembly 244 for pre-treatment of the substrate 210 disposed on the surface of the stacked substrate carriers 240. For example, the heating system 206 of the substrate support assembly 240 may be used to heat one or more substrates 210 supported by the number of the stacked substrate carriers 240 and disposed above the substrate support assembly 244 within the pre-processing treatment region 278.

The substrate support assembly 244 and/or the substrate-latch mechanism 245 are capable of moving upwardly and downwardly (e.g., at least for the vertical distance, Dv, for loading and moving upwardly a newly loaded substrate carrier 240 to the bottom of the stack of the substrate carriers 240) such that the plurality of the substrates 210 previously disposed inside the processing chamber 200 are moved together upwardly for the distance, Dv, from one processing slot 280 to the next processing slot 280.

Optionally, the substrate support assembly 244 may horizontally rotate in the direction 274 (e.g., clockwise or counter-clockwise for a degree of more than zero and less than 360°) and move the stack of the plurality of the substrate carriers 240, together with the substrates 210 disposed thereon, in order to obtain uniform horizontal gas distribution through each of the processing slots 280 when multiple substrates 210 are concurrently and continuously processed inside the processing chamber 200.

In one or more embodiment, once a new substrate is loaded near the bottom of the stack of the plurality of the substrate carriers 240, the substrates already positioned within the processing chamber 200 and the newly-loaded substrate can all be supported by the substrate-latch mechanism 245. Then, the substrate support assembly 244 can move downwardly in the direction 272 to receive another substrate 210 carried by another substrate carrier 240.

Referring back to FIG. 1, when multiple substrates 210 are loaded one after another inside the processing chamber 20, with each loading of a new substrate, each of the multiple substrates 210 is able to pass through each of the multiple processing slots 280 within the internal region 208 of the processing chamber 200. After processing of a single substrate is completed, the substrate carrier 240 carrying the processed substrate thereon may be transferred out of the processing chamber 200 in a substrate-out direction 232 (e.g., in a horizontal direction and via a slit valve near the second opening 230).

In one aspect, the height of the volume for each processing slot 280 (e.g., the vertical distance, Dv, between two processing slots 280) corresponds to the distance between two movable substrate carriers 240 loaded inside the processing chamber 200 and supported by the substrate-latch mechanism 245. For example, the height of the plurality of the spacer pins 242 may correspond to the height of each processing slot 280 within the processing chamber 200 (e.g., the height of the spacer pins 242 as shown in FIG. 4 can be close to and less than the vertical distance, Dv).

Accordingly, the volume of each processing slot 280 can be kept minimal and such small volume enables each processing step performed in each processing slot 280 to be more efficient. In another aspect, by vertically stacking up multiple movable substrate carriers 240 within the processing chamber 200, multiple processing slots 280 are formed vertically between the first opening 220 and the second opening 230 of the batch substrate processing chamber 200 to reduce chamber footprint and keep the batch substrate processing chamber 200 vey compact for processing multiple substrates 210 in the multiple processing slots 280. In one aspect, each processing slot 280 within the processing chamber 200 is configured for receiving and processing one single substrate at a time.

When each substrate carrier 240 carrying the substrate 210 thereon is newly transferred inside the internal region 208 of the chamber body 202, it is continuously stacked to the previous substrate carrier 240 and moved (e.g., vertically and upwardly) through each of the multiple processing slots 280, one by one, before being transferred out of the processing chamber 200. The substrate 210 is thus being processed through each of the multiple processing slots 280.

Each processing slot 280 is in fluid communication with a gas delivery system and/or an exhaust system (e.g., fluid delivery channels 252, fluid outlets 262, and an exhaust system 260 as discussed in FIGS. 2, 3, 5A-5C below) for delivering precursor fluids, process gases, purge gases, and other reactive and nonreactive gases in horizontal directions through the surface of each substrate 210 disposed on each substrate carrier 240. In one aspect, at least one substrate, being disposed within one of the multiple processing slots 280, is exposed to the reactive precursor and/or non-reactive fluids and gases, flowing (e.g., in horizontal directions) through each processing slot 280. In addition, each processing slot 280 is capable of receiving at least one substrate 210 and performing one or more processing steps on the substrate 210 upon transferring each substrate 210 inside the chamber body 202 and continuously moving the plurality of the substrates 210 through each of the multiple processing slots 280.

Accordingly, each substrate 210, once positioned on the substrate carrier 240 and transferred inside the processing chamber 200, is continuously moved through each of the multiple processing slots 280 within the internal region 208 of the processing chamber 200, where a semiconductor process (e.g., ALD and other epitaxial process) is continuously performed in multiple times (e.g., cyclically as described in further detail in FIG. 5A-5C and FIG. 6). Each substrate 210, being carried on the surface of the substrate carrier 240, is processed from one processing slot 280, continuously moved up to another processing slot 280 and through each of the multiple processing slots 280 and then transferred out of the processing chamber 200.

In general, the processing chamber 200 is used for performing at least one semiconductor process (e.g., CVD, PVD, ALD, annealing, among others) on a plurality of substrates 210. In one or more embodiment, the processing chamber 200 is designed to meet the needs of the process regime of an atomic layer deposition (ALD) process under controlled temperature and pressure. For example, each processing step of a cyclical ALD process may be performed spatially in each of the processing slots 280 of the processing chamber 200. Alternatively, each processing step of a cyclical ALD process may be controlled temporally by delivering of gas flows in pulses (e.g., pulsing of gas flows of various precursor gases, inert carrier gases, and flows of purge gases for short, repeated time periods). As an example, the processing chamber 200 may be used to perform an ALD cyclical process on a group of substrates, where each substrate is processed sequentially through different steps or stages of a typical ALD cyclical process. As another example, the processing chamber 200 may be configured to perform the same process simultaneously on a group of substrates. In one or more embodiment, each of the multiple processing slots 280 can be configured for performing a single step (or stage) of an ALD cyclical process. In another embodiment, the multiple processing slots 280 can be selectively configured for performing the same or different steps of an ALD cyclical process within a defined time period.

Accordingly, the processing chamber 200 is configured with multiple processing slots (e.g., the processing slot 280) with each processing slot 280 is spaced between two stacked substrate carriers 240. The processing slot 280 can thus be compact and minimized. The amounts of expensive precursor compounds to be delivered into the processing slot 280 can be reduced. In addition, process conditions are easier to maintain in a small space (with smaller volume).

In one or more embodiment, the processing chamber 200 is a stand-alone substrate processing system. In another aspect, the processing chamber 200 can be coupled to a multi-chamber substrate processing system and connected to additional chambers (e.g., additional process chambers, transfer chamber, and/or load luck chambers 120, 180). In one or more embodiment, the processing chamber 200 is coupled to two load luck chambers 120, 180 to be capable of continuously and/or simultaneously loading the substrate 210 from one end of the chamber body 202 and unloading a different substrate from another end of the chamber body 202. For example, the load luck chamber 120 can be used to load the substrate carrier 240 carrying the substrate 210 to be processed from the lower end of the chamber body 202, whereas the load luck chamber 180 can be used to unload another substrate from the upper end of the chamber body 202. In one aspect, the loading and unloading of the substrate-carrying substrate carriers 240 are performed at the same time (concurrently or simultaneously) to improve system throughput and maintain consistent substrate processing conditions inside the processing chamber 200.

The processing chamber 200 may be coupled to a multi-chamber substrate processing system, which may include one or more pre-processing treatment chambers, post-processing treatment chambers, heating chambers, transfer chambers with one or more transfer robots, wafer storage cassettes, a factory interface, and/or an utility tower, among others, A system controller is connected to the processing chamber 200 and/or the multi-chamber substrate processing system for controlling the process performed inside the processing chamber 200. In some embodiments; a transfer robot is required to load and unload the substrate carrier 240 into the processing chamber 200.

Figure 3:
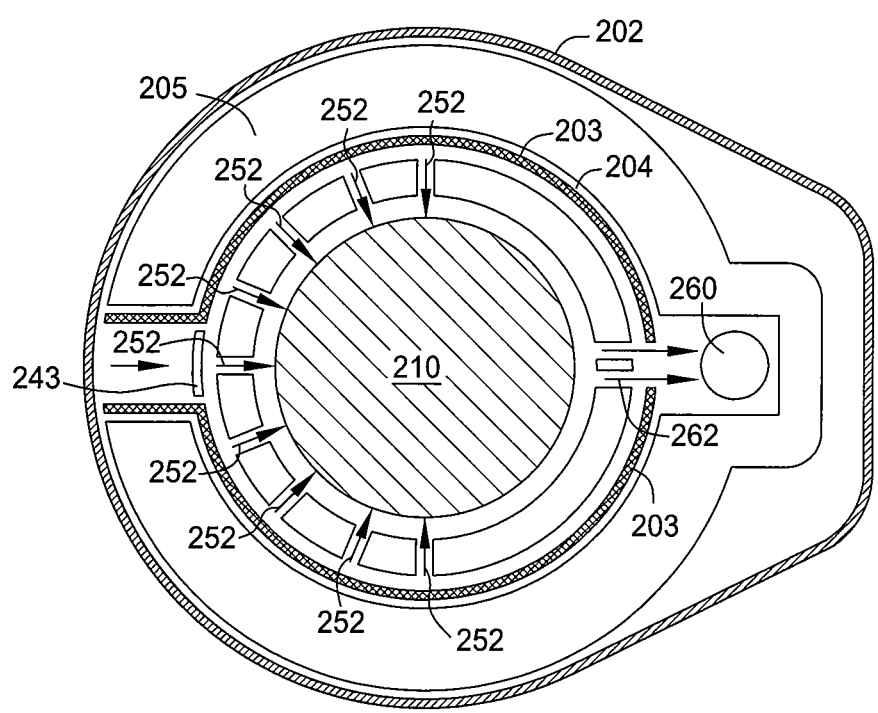
FIG. 3 illustrates a schematic horizontal cross-sectional view of a processing slot connecting to a fluid delivery system for introducing processing gases and fluids, and to an exhaust system for removing gases and fluids.

FIG. 3 is a schematic horizontal cross-sectional view of one example of the processing slot 280 above the surface of the substrate 210 being carried on the substrate carrier 240 (not shown), illustrating the horizontal gas flows within the processing slot 280. In some embodiments, the multiple processing slots 280 within the processing chamber 200 are enclosed in dual containment. For example, each of the multiple processing slots 280 inside the chamber body 202 of the processing chamber 200 may be enclosed within the internal region 208 of a bell jar body 203. The bell jar body 203 is, in turn, enclosed within a heating cavity 204 of a heating system 205 such that the temperature within the processing slots 280 can be controlled and maintained. For example, substrate processing by a typical CVD or ALD process is generally performed at a temperature between about 200° C. and about 800° C., such as between about 350° C. and about 450° C.

A fluid delivery system is connected to the processing chamber 200 for introducing process gases (e.g., reactive precursor gases, fluids, carrier gases, nonreactive inert gases, and other reactive or non-reactive gases and fluids) into the processing slot 280. For example, the fluid delivery system may deliver one or more flows of process gases into each processing slot 280.

As shown in FIG. 3, each flow of a process gas directed into each processing slot 280 may be spatially separated and divided into multiple gas flows (e.g., via multiple fluid delivery channels 252) for evenly distributing process gases from the outer circumference of each substrate and uniformly over the surface of the substrate 210. In addition, an exhaust system 260 is connected to the processing chamber 200 for removing gases (e.g., process wastes and fluids) out of the processing slot 280 in one or more gas flows (e.g., via one or more fluid outlets 262). Accordingly, the spatially arrangements of the fluid delivery channels 252 and the fluid outlets 262 are designed to direct process gases being flown evenly and uniformly across the surface of the substrate 210 (e.g., flowing-in via the multiple fluid delivery channels 252 from multiple horizontal directions and flowing-out via the one or more fluid outlets 262).

Figure 4A:
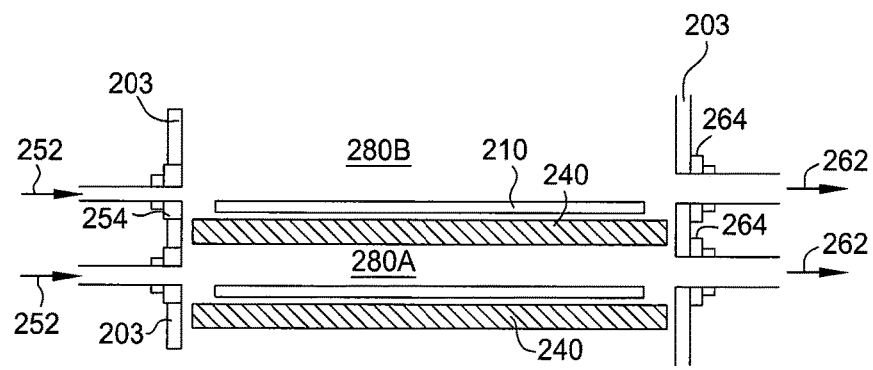
FIG. 4A is a schematic side view of two processing slots inside a substrate processing chamber, showing the delivering of multiple flows of processing gases and fluids into and out of the substrate processing chamber.

FIG. 4A is a schematic side view of a portion of the processing chamber 200, demonstrating the delivery of process gases into two or more processing slots 280A, 280B. In an alternative embodiment, plasma enhanced ALD or CVD process may be performed inside the processing chamber 200 by connecting some or all of the processing slots 280 to a local or remote plasma source via the side of the bell jar body 203.

In some embodiments, two or more sets of fluid delivery channels 252, which are connected to a fluid source, may be disposed on the vertical side of the bell jar body 203 to deliver process gases into the two or more processing slots 280A, 280B. Two or more valves 254 may be used to control the flows of process gases into the processing slots 280A, 280B.

In addition, two or more sets of fluid outlets 262, which are connected to an exhaust system, may be disposed on the vertical side of the bell jar body 203 (e.g., on the opposite side of the fluid delivery channels 252 to deliver process gases out of the two or more processing slots 280A, 280B. Two or more valves 264 may be used to control gas flows out of the processing slots 280A, 280B.

Figure 4B:
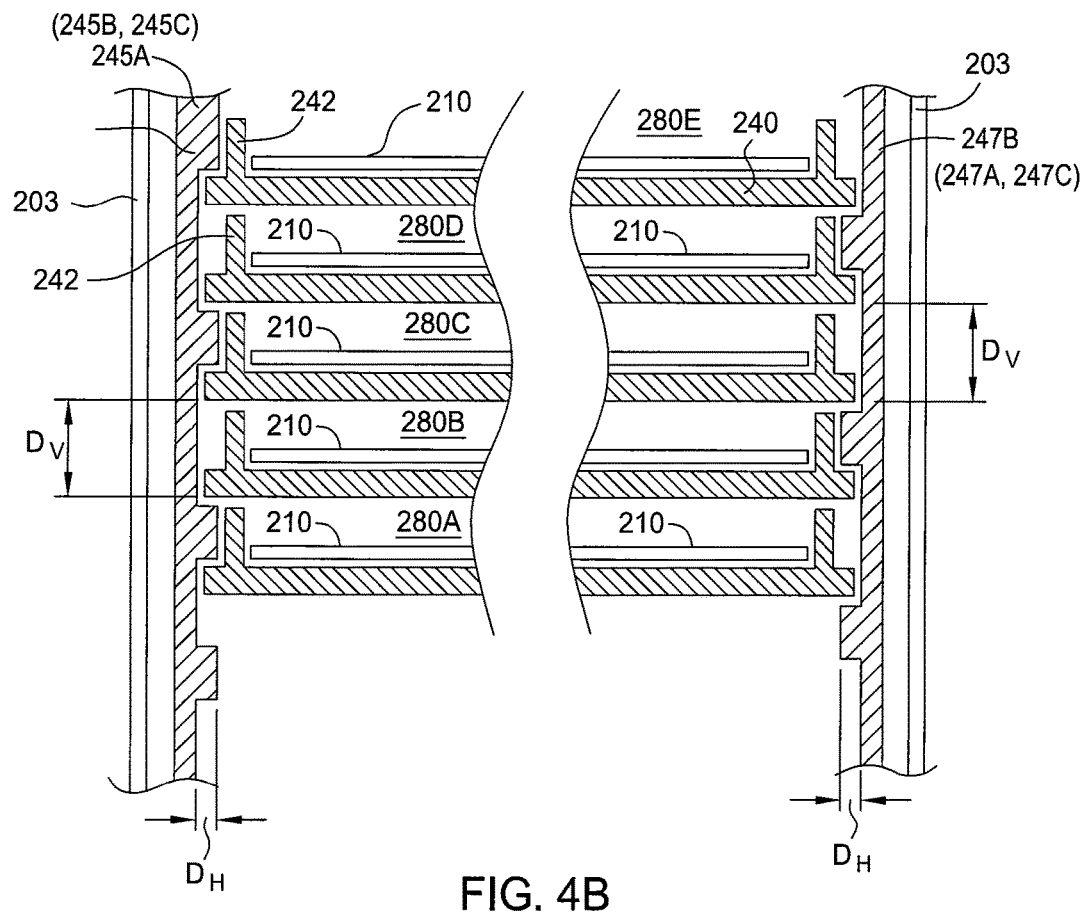
FIG. 4B is a schematic side view of multiple substrates being supported by multiple movable substrate carriers and substrate lift mechanisms within multiple processing slots of a substrate processing chamber.

FIG. 4B is a schematic side view of multiple substrates 210 being supported by multiple movable substrate carriers 240 and continuously being processed within the multiple processing slots 280 of the processing chamber 200. In a continuous substrate process, in addition to the substrate support assembly 244 to upwardly move the stack of multiple substrate carriers 240, the plurality of the substrates 210 disposed on the stack of the substrate carriers 240 can be, additionally or alternatively, moved up by a substrate lifting assembly disposed within the internal region 208 (e.g., around the vertical wall of the bell jar body 203) such that each sub substrate 210 can be continuously moved up and processed through each and every processing slot 280.

In one example, the substrate lifting assembly may include three substrate lift mechanisms 245A, 245B, 245C, to circumferentially support a first set of the substrate carriers 240, and three substrate lift mechanisms 247A, 247B, 247C, to circumferentially support another set of substrate carriers 240 inside the processing chamber 200. For example, when a substrate carrier is newly transferred inside the processing chamber 200 and moved up be the substrate support assembly 244 to be latched by the substrate-latch mechanism 245, the three substrate lift mechanisms 245A, 245B, 245C may move horizontally sideways for a distance, $D_H$, and vertically downward for a distance, $D_V$, to catch the newly latched substrate carrier, while the three substrate lift mechanisms 247A, 247B, 247C are supporting the rest of the substrate support already stacked the processing chamber 200. Then, the substrate lift mechanisms 245A, 245B, 245C, 247 A, 247B, 247C supporting all of the stacked substrate carriers 240 may move vertically upward for a distance, Dv, such that the substrate 210 on the stacked substrate carriers 240 can be moved vertically upward a distance, Dv, to be processed in the next processing slot 280. In this configuration, each substrate 210 is able to be processed sequentially from processing slot 280A located near the first opening 220 and upwardly through processing slots 280B, 280C, 280D, 280E, etc.

FIGS. 5A-5D illustrate examples of delivering the flows of various process gases within the processing chamber 200 to meet the requirements of an ALD or CVD process. For example, an ALD process for depositing a material layer on the surface of a substrate may require cyclical delivery of two or more precursors (e.g., in temporally-controlled short pulses), which are separated by the delivery of inert gas constantly or in short pulses). In some embodiments, the processing chamber 200 may be configured to carry out several cycles (stages or steps) of an ALD process and each cycle includes separate and sequential steps of delivering precursor gas A, delivering inert purge gas, delivering precursor gas B, and delivering inert purge gas over the surface of the substrate. Accordingly, the configuration of the processing chamber 200 provides the delivery of each gas flow of precursor A, purge gas, precursor B, and/or other precursors to be spatially separated into each processing slot 280. In addition to spatial separation by the chamber designs, the delivery of each gas flow of precursor A, purge gas, precursor B, and/or other precursors can also be controlled temporally Exemplary suitable materials that can be deposited on the surface of the substrate 210 disposed inside the processing chamber 200 include, but are not limited to, various nitrides, oxides, carbides, among others. For example, for depositing a tantalum nitride (TaN) material layer over a surface of the substrate 210, two precursor compounds may be used. The first precursor may be a tantalum containing compound, such as a tantalum based organo-metallic precursor or a derivative thereof, e.g., pentadimethylamino-tantalum (PDMAT; $Ta(NMe_2)s$), pentaethylmethylamino-tantalum (PEMAT; $Ta[N(C_2H_5CH_3)_2]_5$), pentadiethylaminotantalum (PDEAT; $Ta(NEt_2)_5$), TBTDET ($Ta(NEt_2)_3NC_4H_9$ or $C_{16}H_{39}N_4Ta$) and tantalum halides, and any and all of derivatives of the above listed compounds. The tantalum containing compound may be provided as a gas or may be provided with the aid of a carrier gas. Examples of carrier gases which may be used include, but are not limited to, helium (He), argon (Ar), nitrogen ($N_2$), and hydrogen ($H_2$).

After the delivery of the first precursor gas (precursor gas A) into the processing slot 280 of the processing chamber 200, a monolayer of the tantalum containing compound is chemisorbed onto the surface of the substrate 210 and excess tantalum containing compound is removed from the process chamber by introducing a pulse of a purge gas thereto. Examples of purge gases which may be used include, but are not limited to, helium (He), argon (Ar), nitrogen ($N_2$), hydrogen ($H_2$). and other gases.

After the process chamber has been purged, a second precursor gas (precursor gas B) may be delivered into the processing slots 280 of the processing chamber 200. The second precursor may be a nitrogen containing compound with nitrogen atoms and one or more reactive atoms/species. For example, the nitrogen containing compound may be ammonia gas ($NH_3$) and other nitrogen containing compounds, including, but not limited to, $N_xH_y$, with x and y being integers (e.g., hydrazine ($N_2H_4$)), dimethyl hydrazine (($CH_3$)$_2N_2H_2$), t-butylhydrazine ($C_4H_9N_2H_3$) phenylhydrazine ($C_6H_5N_2H_3$), other hydrazine derivatives, a nitrogen plasma source (e.g., $N_2$, $N_2/H_2$, $NH_3$, or a $N_2H_4$ plasma), 2,2'-azoisobutane (($CH_3$)$_6C_2N_2$), ethylazide ($C_2H_5N_3$), and other suitable gases. The nitrogen containing compound may be introduced into the processing slot 280 as a pulse, and may be provided alone. Alternatively, a carrier gas may be used to deliver the nitrogen containing compound if necessary.

After the delivery of the second precursor gas (precursor gas A) into the processing slot 280 of the processing chamber 200, a monolayer of the nitrogen containing compound may then be chemisorbed on the monolayer of the tantalum containing compound. The composition and structure of precursors on a surface during atomic-layer deposition (ALD) is not precisely known. Not wishing to be bound by theory, it is believed that the chemisorbed monolayer of the nitrogen containing compound reacts with the monolayer of the tantalum containing compound to form a tantalum nitride layer. Reactive species from the two precursor compounds may form by-products that are transported from the substrate surface (e.g., via the fluid outlets 262 and the exhaust system 260). It is believed that the reaction of the nitrogen containing compound with the tantalum containing compound is self-limiting and, in each pulse of delivering a precursor compound into the processing slot 280, only one monolayer of the precursor compound is chemisorbed onto the surface of the substrate 210. Each cycle of the sequential delivery of the two or more alternating precursors over the surface of the substrate is repeated (e.g., 20-30 cycles) until a desired thickness of the material layer (e.g., a tantalum nitride film) is formed.

Figure 5A:
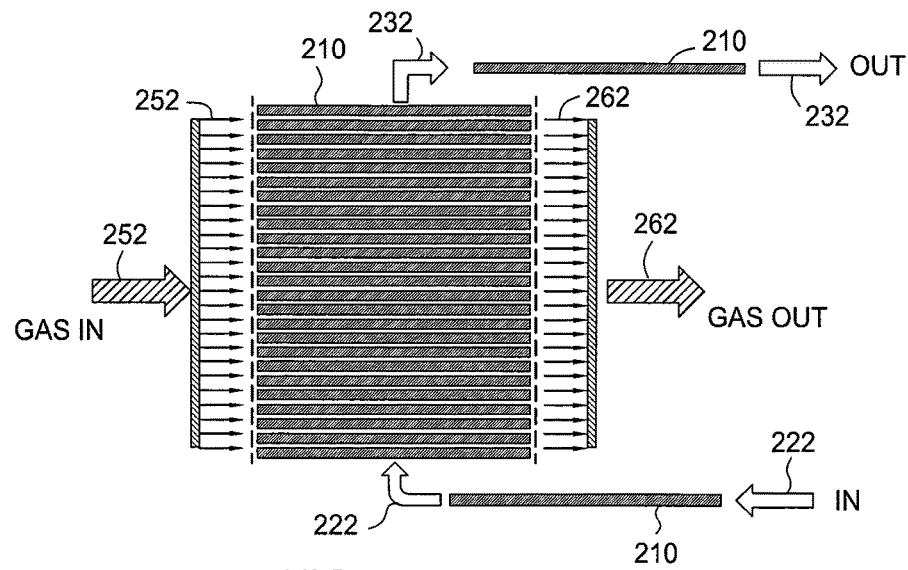
FIG. 5A is a schematic vertical cross-sectional view of a portion of a processing chamber, showing the directions of moving substrates and flowing gases (e.g., precursor gases and fluids) in and out of the substrate processing chamber.

FIG. 5A is a schematic vertical cross-sectional view of the processing chamber 200, showing one example of delivering process gases over the surface of multiple substrates 210 and the directions of the multiple substrates 210 being moved in and out of the processing chamber 200. The processing chamber 200 may be configured to perform sequential steps of a semiconductor process. In an exemplary ALD process performed inside the processing chamber 200, a plurality of the substrates 210 may be processed by horizontally delivering precursor gas A, precursor gas B, the inert gas, and/or other process gases inside the processing chamber 200 via the multiple fluid delivery channels 252 and out of the processing chamber 200 via the fluid outlet 262, while each substrate 210 is moving vertically and upwardly through each and every one of multiple processing slots 280 inside the processing chamber 200.

Figure 5B:
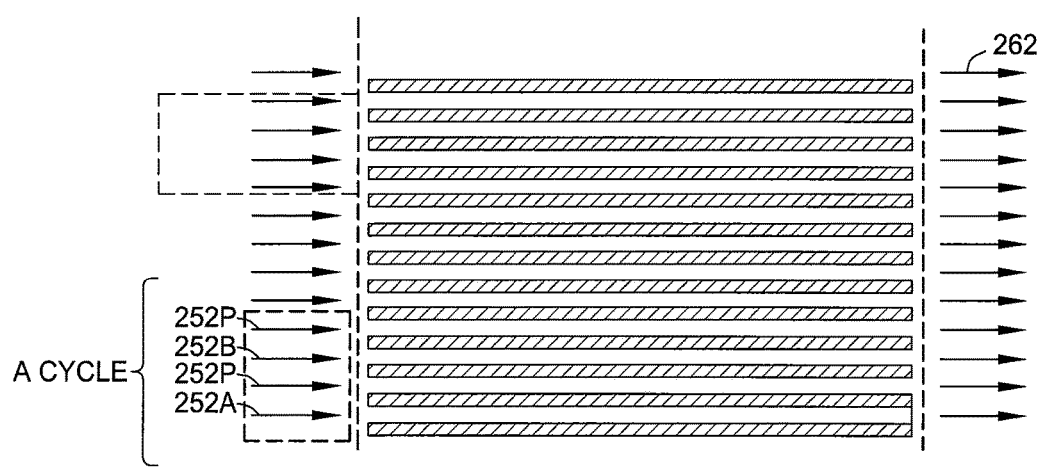
FIG. 5B is a schematic side view of one configuration of flowing different types of gases (e.g., precursor gases and fluids) in and out of the multiple processing slots of the substrate processing chamber.

FIG. 5B is a schematic vertical cross-sectional view of the processing chamber 200, showing some embodiments of multiple flows of process gases (e.g., inert and precursor gases or other fluids) in and out of the processing chamber 200. In one example, the fluid delivery channels 252 may be configured into groups, each group includes a fluid delivery channel 252A, a fluid delivery channel 252P, a fluid delivery channel 252B, and a fluid delivery channel 252P, for delivery of precursor gas A, inert purge gas, precursor gas B, and inert purge gas, respectively. In one or more embodiment, each of the flows of precursor gas A, precursor gas B, and inert purge gas are constantly delivered into the small space of the processing slots 280, while the substrate 210 is move upwardly and quickly through each of the processing slots 280. Accordingly, the substrate 210 can be exposed to cycles of precursor gas A, inert purge gas, precursor gas B, and inert gas in short time periods.

Figure 5C:
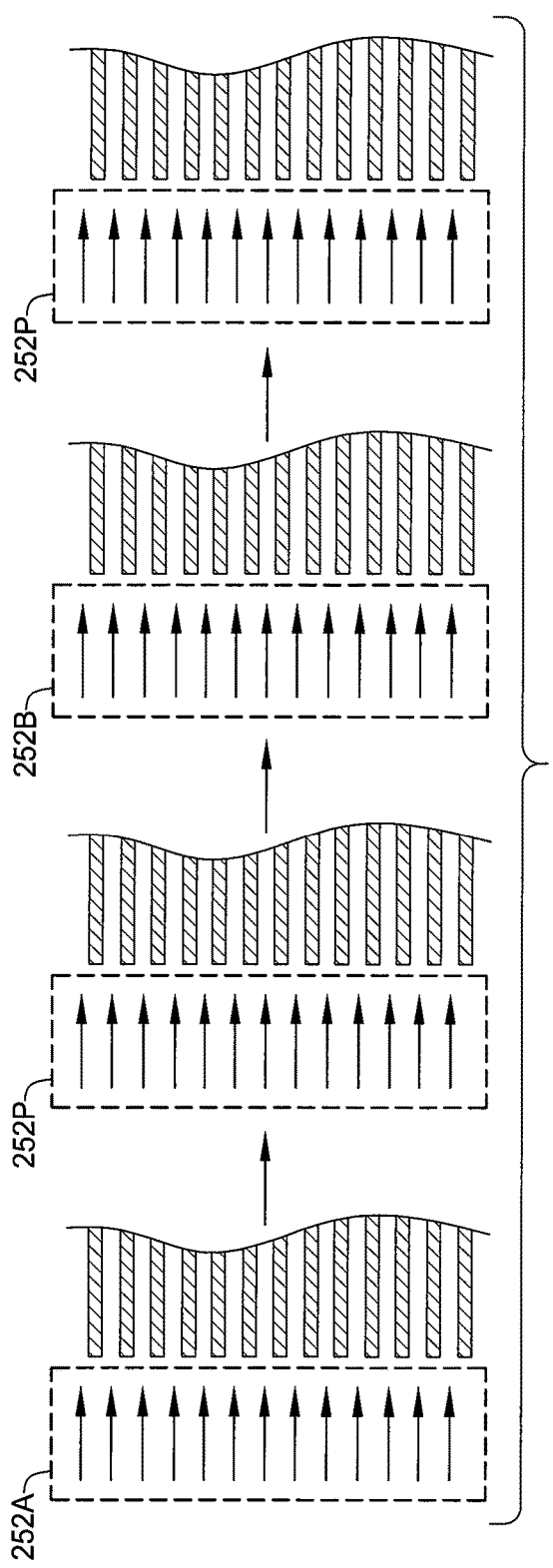
FIG. 5C is a schematic side view of one or more embodiment of flowing different types of gases (e.g., precursor gases and fluids) in and out of the multiple processing slots of the substrate processing chamber.

FIG. 5C illustrates an embodiment delivering multiple flows of process gases (e.g., precursor gases and inert gases or fluids) in and out of the processing chamber 200. In one or more embodiment, while each of the substrates 210 is moving upwardly through each of the processing slots 280 inside the processing chamber 200, all of the substrates 210 (batch processing or a hybrid batch) may be exposed to a flow of precursor gas A for a first time period, another gas flow of inert purge gas for a second time period, another gas flow of precursor gas B for a third time period, and another gas flow of inert purge gas for a fourth time period. Each cycle of sequential delivery of gas flows of precursor gas A, inert purge gas, precursor gas B, and inert purge gas may be repeated until a desired thickness of a material layer is deposited over the surface of the substrate 210. Alternatively, the gas flow of inert gases may be delivered constantly inside the processing chamber 200, while alternating the gas flows of one precursor gas (e.g., precursor gas A) and another precursor gas (e.g., precursor gas B). The precursor gas A, precursor gas B, and the inert gas may be delivered inside the processing chamber 200 via the multiple fluid delivery channels 252 and out of the processing chamber 200 via the fluid outlet 262.

Figure 5D:
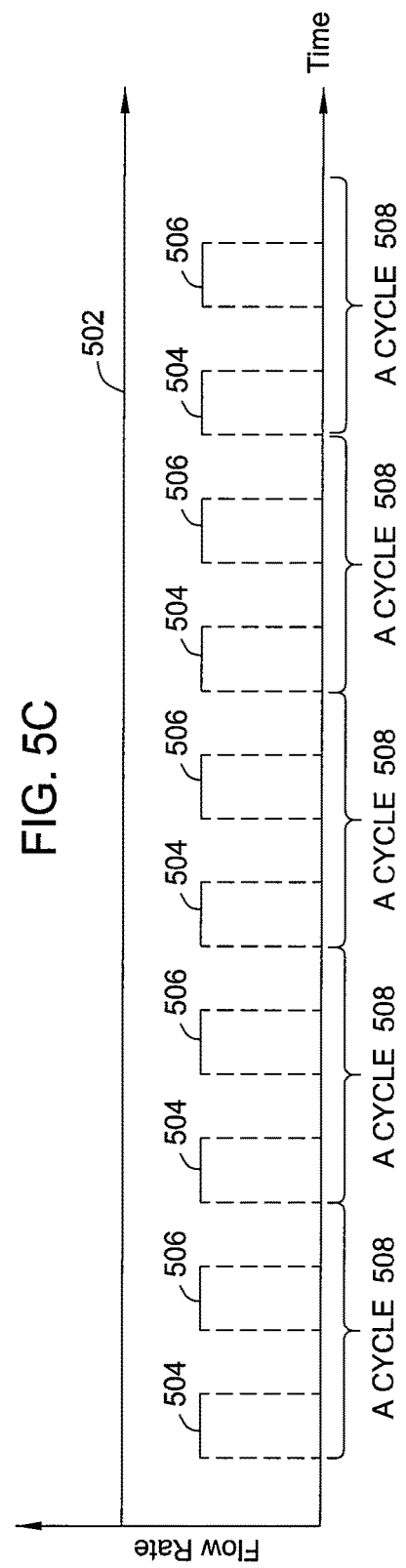
FIG. 5D illustrates one or more embodiment of delivering into the substrate processing chamber various types of gases flows (e.g., precursor gases and purge gases) suitable for a cyclical ALD process.

FIG. 5D is a schematic diagram, illustrating an embodiment in delivering multiple flows of process gases (e.g., two or more precursor gases, inert gases, and/or other reactive or non-reactive fluids) in and out of the processing chamber 200 over a period of time. In FIG. 5D, a flow 504 of precursor gas A and a flow 506 of precursor gas B (or additional precursor gas) may be alternatively delivered into the same processing slot 280 (e.g., controlling the precursor gases only temporally) or different processing slot 280 (e.g., controlling the precursor gases spatially) and in pulses (e.g., controlling the precursor gases temporally) inside the processing chamber 200, while a gas flow 502 of a purge gas is constantly delivered into the processing slots 280.

Figure 6:
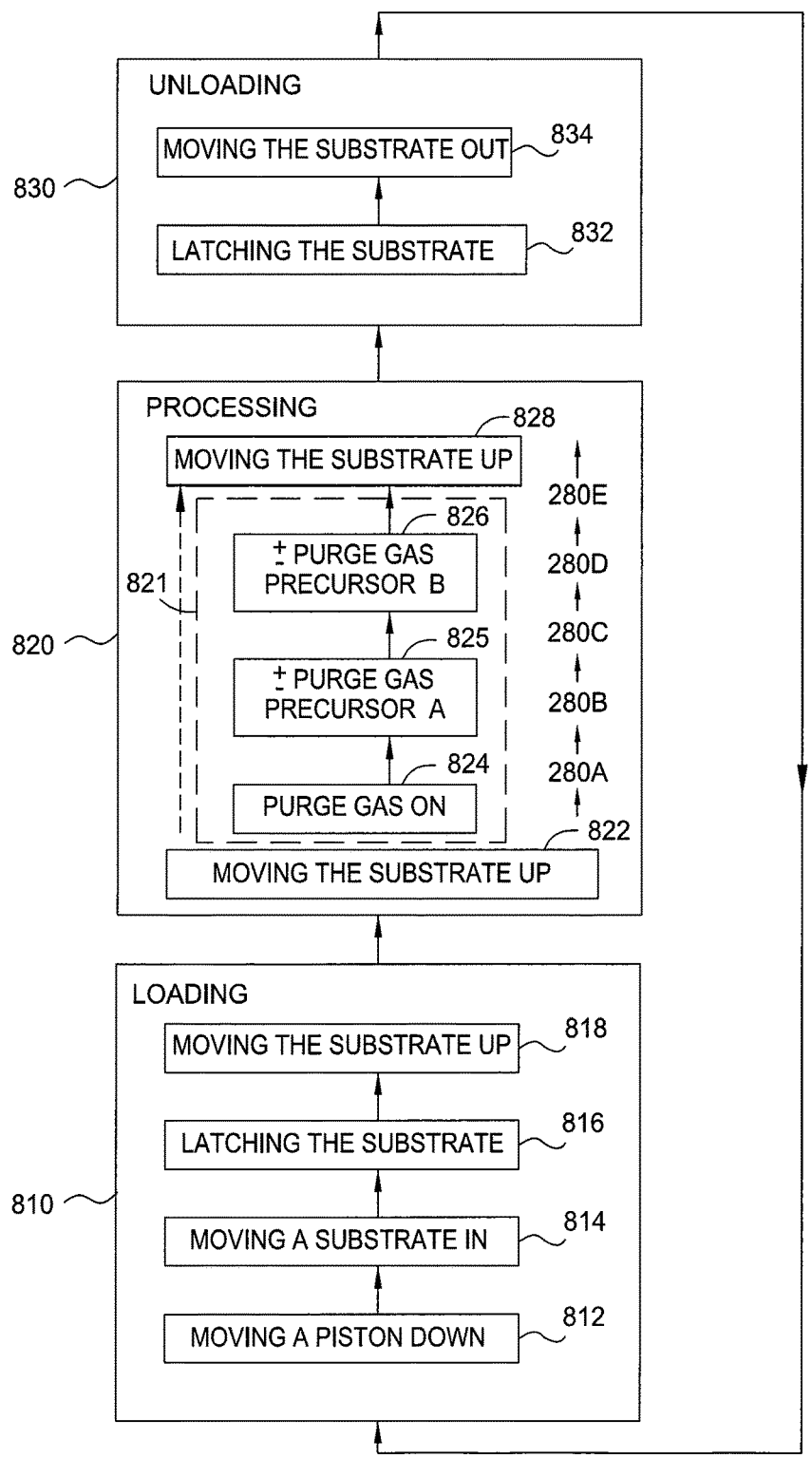
FIG. 6 is a method of processing a substrate within a substrate system having a substrate processing chamber, in accordance with one or more embodiment of the invention.

FIG. 6 is one example of a method 800 of processing a plurality of the substrates 210 within the batch substrate processing chamber 200. Each substrate 210 may be processed within each of the processing slots 280 in an ALO process schemes to cyclically form monolayers of precursor A and precursor B over its surface. The method 800 may include a loading stage 810, a processing stage 820, and an unloading stage 830.

The loading stage 810 is configured to load one substrate 210 (e.g., being carried on a substrate carrier 240) into the processing chamber 200. The loading stage 810 includes a step 812 for moving down a piston to receive the substrate 210 disposed on the substrate carrier 240, a step 814 for moving the substrate 210 inside the processing chamber 200, a step 816 for latching the substrate onto the substrate-latch mechanism 245, and a step 818 for moving the substrate up (e.g., by the use of one or more substrate lift mechanisms 245A, 245B, 245C, 247A, 247B, 247C) within the internal region of the processing chamber 200.

The processing stage 820 is configured to process one substrate 210 in each of the processing slots 280. For example, by vertically moving the substrate 210 sequentially through the processing slot 280A, 280B, 280C, 280D, and 280E. The processing stage 820 includes a step 822 for moving a substrate up (e.g., by the use of one or more substrate lift mechanisms 245A, 245B, 245C, 247A, 247B, 247C).

Each substrate 210 is then continuously and sequentially exposed to a flow of purge gas at step 824 (in pulses or a constant gas flow), a flow of precursor A at step 825 (with or without the aid of a purge gas or carrier gas), and a flow of precursor 8 at step 826 (with or without the aid of a purge gas or carrier gas). Next, at step 828, the substrate 210 is continuously being moved vertically upward through the processing slots 280 and at the same time exposed to cycles of gas flows of precursor A, purge gas, precursor B, and purge gas.

Next, the unloading stage 830 is configured to unload one substrate 210 (e.g., being carried on the substrate carrier 240) outside the processing chamber 200. The unloading stage 830 includes a step 832 for latching the substrate disposed on the substrate carrier 240 by a transfer mechanism (e.g., a transfer robot) and a step 834 for moving the substrate 210 outside the processing chamber 200 by the transfer mechanism.

In one or more embodiment, the processing chamber 200 is configured to process a plurality of the substrate 210 simultaneously, for example, by concurrently performing each loading stage 810, processing stage 820, and unloading stage 830 on a number of substrates inside the processing chamber 200. In additional, loading of one substrate and unloading of another substrate can be performed simultaneously to save time and prevent interference of the ALD processing of additional substrates inside the processing chamber 200.

While the foregoing is directed to embodiments of the present invention, other and further embodiments of the invention may be devised without departing from the basic scope thereof, and the scope thereof is determined by the claims that follow.

What is claimed is:

1. A method for processing a plurality of substrates, the method comprising:
    loading at least one of the plurality of substrates on a substrate carrier into a first end of a chamber body of a processing chamber through a first opening near a bottom end of the chamber body, the processing chamber comprising a substrate latch comprising at least three movable contacting latches positioned near the bottom end of the chamber body above the first opening, the at least three movable contacting latches configured to support a vertical stack of substrate carriers;
    moving the substrate carrier upward from the first opening near the bottom end of the chamber body to a second opening near a top end of the chamber body, the substrate carrier passing through a plurality of processing slots formed between the first end and a second end of the chamber body, each processing slot processes at least one of the plurality of the substrates; and
    unloading at least one of the plurality of substrates out of the second opening of the chamber body.

2. The method of claim 1, wherein each of the substrate carriers comprise a plurality of spacer pins to separate a substrate supported on a first substrate carrier from a substrate supported on a second substrate carrier while the first and the second substrate carriers are moved through each of a plurality of the processing slots.

3. The method of claim 2, wherein the plurality of spacer pins are positioned on an outer circumference of the substrate carriers.

4. The method of claim 1, wherein each of the plurality of processing slots is in fluid communication with a fluid delivery channel of a gas delivery system and a fluid outlet of an exhaust system to deliver a flow of gas across each of the plurality of processing slots.

5. The method of claim 1, wherein the processing chamber further comprises a substrate support assembly to secure and support an additional substrate carrier and load the additional substrate carrier into the processing chamber from a bottom of the vertical stack of substrate carriers.

6. The method of claim 5, wherein loading the additional substrate carrier into the first end of the chamber body comprises:
elevating the vertical stack of substrate carriers with the substrate support assembly to a position above the first opening;
moving the movable contacting latches to a support position where the movable contacting latches circumferentially support the vertical stack of substrate carriers;
lowering the substrate support assembly to a position to support an additional substrate carrier;
positioning the additional substrate carrier on the substrate support assembly;
moving the substrate support assembly upward with the additional substrate carrier to contact the bottom of the vertical stack of substrate carriers; and
moving the movable contacting latches from the support position to a non-supporting position so that the substrate support assembly with the additional substrate carrier support the vertical stack of substrate carriers.

7. The method of claim 6, wherein each of the plurality of processing slots processes one single substrate at a time.

8. The method of claim 6, wherein each of the plurality of substrates is transferred inside the chamber body one at a time.

9. The method of claim 6, wherein a volume for each processing slot has a height corresponding to the distance between two movable substrate carriers.

10. A processing method comprising:
positioning at least one substrate onto a substrate carrier;
loading the substrate carrier into a process chamber;
moving the substrate carrier through a plurality of processing slots in the process chamber; and
unloading the substrate carrier from the process chamber,
wherein the process chamber comprises a chamber body with a first opening near a bottom end and a second opening near a top end of the chamber body, a substrate latch comprising at least three movable contacting latches positioned near the bottom end of the chamber body, the at least three movable contacting latches configured to support a vertical stack of substrate carriers, and a substrate support assembly to secure and support an additional substrate carrier and load the additional substrate carrier into the process chamber through the first opening.

11. The method of claim 10, wherein each of the substrate carriers comprise a plurality of spacer pins to separate a substrate supported on a first substrate carrier from a substrate supported on a second substrate carrier while the first and the second substrate carriers are moved through each of the plurality of processing slots.

12. The method of claim 11, wherein the plurality of spacer pins is positioned on an outer circumference of the substrate carriers.

13. The method of claim 10, wherein each of the plurality of processing slots is in fluid communication with a fluid delivery channel of a gas delivery system and a fluid outlet of an exhaust system to deliver a flow of gas across each of the plurality of processing slots.

14. The method of claim 10, wherein loading the substrate carrier into the first end of the chamber body comprises:
elevating a vertical stack of substrate carriers within the chamber body using the substrate support assembly to a position above the first opening;
moving the movable contacting latches to a support position where the movable contacting latches circumferentially support the vertical stack of substrate carriers;
lowering the substrate support assembly;
positioning the substrate carrier on the lowered substrate support assembly;
raising the substrate support assembly so that the substrate carrier contacts the bottom of the vertical stack of substrate carriers; and
moving the movable contacting latches from the support position to a non-supporting position so that the substrate support assembly supports the vertical stack of substrate carriers.

15. The method of claim 14, wherein each of the plurality of processing slots processes one single substrate at a time.

16. The method of claim 14, wherein each of the plurality of substrates is transferred inside the chamber body one at a time.

17. The method of claim 14, wherein a volume for each processing slot has a height corresponding to the distance between two movable substrate carriers.

* * * * *